United States Patent
Kahlfuss et al.

[11] Patent Number: 5,942,046
[45] Date of Patent: Aug. 24, 1999

[54] SOLAR MODULE AND PROCESS FOR MANUFACTURING SAME

[75] Inventors: Hans Kahlfuss, Donauwörth; Ludwig Preuss, Neubiberg, both of Germany

[73] Assignee: DaimlerChrysler AG, München, Germany

[21] Appl. No.: 09/042,870

[22] Filed: Mar. 17, 1998

[51] Int. Cl.[6] .................. H01L 31/048; H01L 31/05; H01L 31/0203
[52] U.S. Cl. .................. 136/251; 136/244; 136/259
[58] Field of Search .................. 136/244, 251, 136/256, 259, 292; 438/64, 66, 118, 119

[56] References Cited

U.S. PATENT DOCUMENTS

| | | | |
|---|---|---|---|
| 4,038,104 | 7/1977 | Tsutomu | 136/89 |
| 4,400,577 | 8/1983 | Spear | 136/259 |
| 4,443,652 | 4/1984 | Izu et al. | 136/251 |
| 4,542,578 | 9/1985 | Yamano et al. | 29/572 |
| 4,697,042 | 9/1987 | Schilling | 136/244 |
| 4,915,743 | 4/1990 | Schilling | 136/256 |
| 5,011,544 | 4/1991 | Gaddy et al. | 136/246 |
| 5,259,891 | 11/1993 | Matsuyama et al. | 136/244 |
| 5,391,236 | 2/1995 | Krut et al. | 136/249 |
| 5,397,713 | 3/1995 | Hamamoto et al. | 437/4 |
| 5,542,988 | 8/1996 | Bogus | 136/244 |
| 5,567,248 | 10/1996 | Chung | 136/244 |

*Primary Examiner*—Nam Nguyen
*Assistant Examiner*—Michael C Miggins
*Attorney, Agent, or Firm*—McGlew and Tuttle, P.C.

[57] ABSTRACT

A solar module 1, which has individual solar cells 3 wired with one another in a regular arrangement on a large-area support 2. Cover glasses of the solar cells are provided with an electrically conductive coating. The cover glass elements are conductively connected to one another and finally to the support by means of contact rails. An electrically insulating material is to be introduced in the areas A of mutually adjacent corners between the cover glasses of the solar cells 3, and a lamina consisting of a conductive material, which acts as the connector, is bonded to this material as well as to the corners by means of an electrically conductive adhesive.

5 Claims, 2 Drawing Sheets

SOLAR MODULE AND PROCESS FOR MANUFACTURING SAME

FIELD OF THE INVENTION

The present invention pertains to a solar module with a number of individual solar cells, which are fastened to a large-area support in a regular arrangement and have a cover glass provided with a transparent, conductive coating on their side facing away from the support, wherein the cover glasses are in contact with one another through electrically conductive connectors bonded at their corners to the coating as well as to a process for manufacturing such a solar module.

BACKGROUND OF THE INVENTION

It is frequently required in scientific satellites and sometimes in application satellites that the potential differences on the satellite surface be below certain limits in order to eliminate interference fields during measurements, etc. This can be achieved only if the satellite surface is electrically conductive.

In solar generators, the surface is made conductive by applying a transparent, conductive coating, e.g., one consisting of indium-tin oxide, to the cover glasses of the solar cells. The individual cover glasses must be connected electrically conductively to one another and to the structure, i.e., to their support.

A solar module of the type described in the introduction has been known from DE 36 17 675 C2, which also pertains to the prevention of static charges by electrically connected, conductive layers on the glass surfaces of solar cells. It is described in connection with FIG. 1 there that the individual solar cells arranged on a support likewise carry cover glasses with a conductive coating on the surface. Consequently, a metal coating, which is used to apply a connector consisting of silver, e.g., by bonding, is to be applied at each corner of such a rectangular cover glass.

To fulfill the intended purpose, such an adhesive must be conductive. If the solar cells are arranged on the support as tightly packed as possible to achieve the highest possible surface utilization for the energy generation, and the cover glasses are shaped for the same reasons, unlike in FIG. 1 mentioned, such that they do not laterally project beyond the photoactive part of the solar cell, there always is a risk at the time of the application of the conductive adhesive that this adhesive flows around the edges of the cover glasses and solar cells and thus leads to short-circuits Further,connectors which are bonded, as is shown in the FIG. 1 mentioned, only at the corners of the cover glasses and extend quasi freely suspended between the corners, with or without an additional loop, always involve the risk that they will be cracked or even torn off as a consequence of shocks, bending or vibrations, as a result of which the desired electrical connection between the surfaces of the cover glasses is partially lost. Such a tearing off may also lead to short-circuits when the ends that become free enter the gap between the solar cells. This disadvantageous effect may also occur when the arch of the loop of such a connector reverses, so to speak, because of the above-mentioned shocks, as a result of which the connector also enters between the solar cells and may establish undesired contacts there.

SUMMARY AND OBJECTS OF THE INVENTION

The primary object of the present invention is to provide a solar module of the type described in the introduction, in which the electrically conductive connection between the cover glasses is brought about in the most stable and durable manner possible and by avoiding the risk of short-circuit between the solar cells.

According to the invention, a solar module is provided with a number of individual solar cells. The individual solar cells are fastened to a large-area support in a regular arrangement and have a cover glass provided with a transparent, conductive coating on their side facing away from the support. The cover glasses are in contact with one another through electrically conductive connectors bonded at their corners to the coating. An electrically insulating material is introduced in the areas of mutually adjacent corners between the cover glasses. The connectors are designed as laminas and are bonded to the corners and the surface of the insulating material located between them by means of a conductive adhesive.

Thus, an electrically insulating material is to be introduced between the cover glasses in the areas of mutually adjacent corners, the connectors are to be designed as laminas and bonded to the corners and the surface of the insulating material located between them by means of conductive adhesive.

The electrically insulating material, which is now located between the cover glasses, prevents the electrically conductive adhesive from getting between the solar cells and causing short-circuits there. At the same time, it forms a contiguous substrate for the conductive adhesive and for the laminas bonded by means of the adhesive, preferably at the same level as the surface of the cover glasses or the transparent, conductive coating located on same. The bond consisting of the contiguous adhesive layer and the laminas on the contiguous, stabilizing substrate, which is established by means of the insulating material, forms a resistant and durable electric connection between the cover glasses. There is a far lesser risk that this connection would be completely interrupted by tearing of the connector than in the case of the above-described, prior-art embodiment. The adhesive layer, in particular, has a certain elasticity, so that an electrical connection persists even if small cracks should have formed in the laminas.

According to a special embodiment of the present invention, the electrically insulating material is introduced in a cross-like arrangement between four adjacent cover glass corners. It is recommended in this case that the laminas be made round or square. Thus, all four mutually adjacent cover glasses are connected, so to speak, in parallel to one another.

However, it is also possible to introduce the electrically insulating material only between two mutually adjacent cover glass corners. The laminas may now be designed as rectangular strips. Other suitable shapes are, of course, also conceivable and permissible for the laminas.

An especially stable and durable design is obtained if the electrically insulating material extends down to the support. The manner of manufacturing a solar module according to the present invention may also be facilitated by using as the electrically insulating material the same adhesive, with which the solar cells are also bonded to the support.

Concerning this embodiment, the solar module can be manufactured in the following manner:

In the intended arrangement, the solar cells are first fastened on a large-area auxiliary support in an easily detachable manner, so to speak, inverted, i.e., with their cover glasses. It is possible to use, e.g., an adhesive tape or a self-sticking film as such an auxiliary support. Using a masking technique, it is subsequently ensured that the reverse sides of the individual solar cells and, at the same time, the areas of adjacent solar cell or cover glass corners, which areas are intended for the connectors, remain free for the adhesive, which is to be applied now. Thus the adhesive is distributed uniformly on the reverse sides of the solar cells and penetrates into the areas between the corners of the solar cells and cover glasses, down to the auxiliary support. After removing the mask, the support is bonded to the reverse sides of the solar cells over a large area. The auxiliary support is subsequently detached from the other side, so that the individual laminas can now be bonded by means of an electrically conductive adhesive after the curing of the adhesive.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
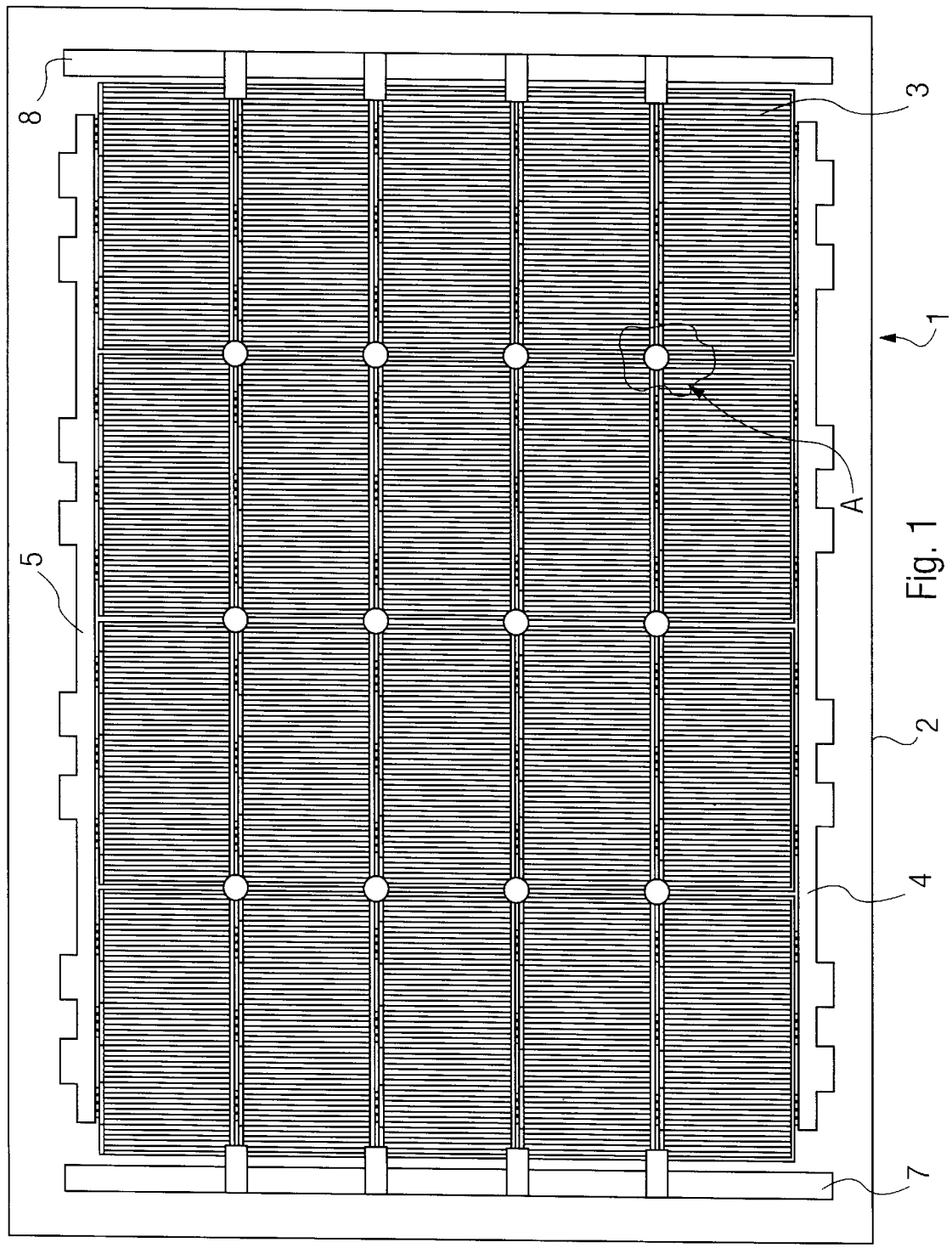
FIG. 1 is a top view of a solar module according to the present invention.

Referring to the drawings in particular, FIG. 1 shows the top view of a solar module 1, on which a total of 20 solar cells are arranged, one of them being designated by 3. Five solar cells each are connected in series, and four of these series-connected arrangements are connected in parallel to one another by means of two contact rails 4 and 5. The surfaces of the solar cells 3, which carry a cover glass each, which latter is provided with a transparent, conductive coating, face the observer. The cover glasses are connected electrically to one another by connectors shown in a round shape, and, as a whole, to the structure, i.e., the support 2, via additional contact rails 7 and 8.

Figure 2:
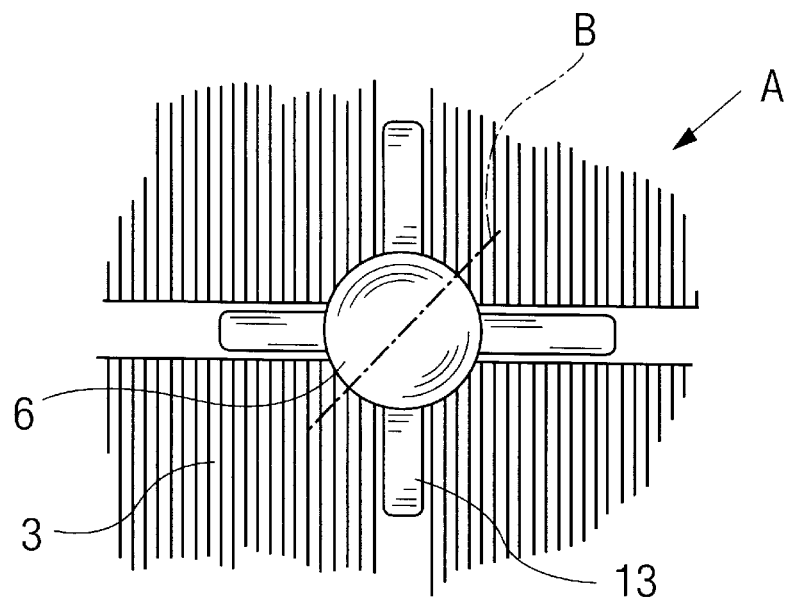
FIG. 2 is a top view of a detail of the solar module according to FIG. 1.

FIG. 2 shows an enlarged representation of the area A mentioned already in connection with FIG. 1, namely, an area of adjacent corners of four cover glasses. The four cover glass surfaces with their transparent, electrically conductive coatings again face the observer. An electrically insulating material 13 is introduced in a crosslike arrangement between the four corners of the mutually adjacent cover glasses. Finally, a round lamina 6 acting as an electrical connector is bonded such that it conductively connects the four adjacent corners of the cover glasses to one another.

Figure 3:
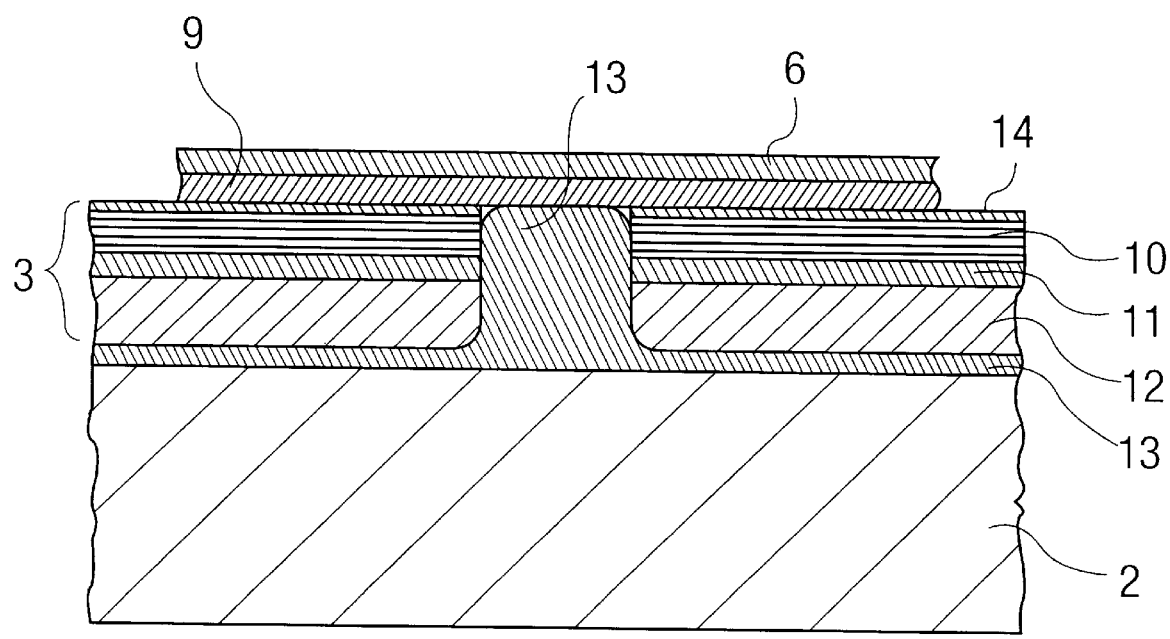
FIG. 3 is a diagonal cross sectional view through the area shown in FIG. 2.

For better understanding, FIG. 3 shows a diagonally directed cross section along the line B in FIG. 2 through the corresponding part of the solar module. First, there is a support 2, on which all solar cells are arranged, and which may consist of, e.g., a rigid honeycomb structure based on a fiber-reinforced plastic. Sectional views of adjacent parts of two solar cells 3, which comprise the photoactive body 12, including the necessary front and reverse side contacts, a transparent, insulating adhesive layer 11, a cover glass 10, as well as a transparent conductive coating 14, are shown.

These solar cells 3 are applied to the support 2 by means of an adhesive, which is an electrically insulating material 13 and is introduced between the individual solar cells in the area of mutually adjacent corners up to the level of the transparent, electrically conductive coating 14. Consequently, the electrically non-conductive material 13 is located in the area not only between the cover glasses 10, but it also extends down to the surface of the support 2 and passes there over into the adhesive layer, which connects the support 2 and the solar cells 3 to one another. Thus, the electrically insulated material 13, which is arranged in a cross-like pattern in the area according to FIG. 2, is anchored on the support 2 in a resistant and durable manner. The level of the electrically insulating material 13 does not necessarily have to be flush with the coating 14, but it must preferably be higher than that of the adhesive layer 11.

The arrangement described so far can be manufactured according to the process described above. The individual solar cells 3 are to be fastened in the desired arrangement with the cover glasses 10 and the transparent, conductive coatings 14 located thereon on a contiguous auxiliary support. Using a masking technique, it is to be subsequently ensured that the electrically insulating material 13 will be applied in the form of an adhesive to the reverse sides of the solar cells 3 facing away from the cover glasses 10 and can additionally also enter between the solar cells 3, including the cover glasses 10, in the corner areas, so that the electrically insulating material 13 will be distributed as shown in FIGS. 2 and 3. It can be determined in this respect from FIG. 2 that using the masking technique, the adhesive can be prevented from penetrating too far outside the corner areas intended for the connectors between the solar cells, because space must be left there for the electrical wiring of the solar cells. After the auxiliary support has been detached from the cover glass side and after the large-area bonding of the support 2 on the other side, the connectors can then be bonded in the corner areas. The electrically insulating material 13 may, of course, also be applied manually to the support 2 after the application of the solar cells 3, e.g., by means of a metering unit. However, this is unfavorable for series manufacture.

In the version according to FIGS. 2 and 3, the connector has the shape of a round lamina 6, which is bonded by means of a layer 9 of an electrically conductive adhesive such that a contiguous electric connection is present, which is supported on the electrically insulating material 13 between the cover glasses 10. As can be seen, the electrically conductive adhesive 9 is prevented as a result from penetrating between the cover glasses 10 and the solar cells 3 and from leading to short-circuits there. The prerequisite for this is, of course, that the electrically insulating material 13 also projects in the corner areas between the cover glasses beyond the edges of the lamina 6 to the extent that the flowing out of the initially still flowable, electrically conductive adhesive at the edges of the cover glasses and solar cells is not possible.

Foils punched out correspondingly, which consist of, e.g., silver or other materials with good conductivity, e.g., gold, molybdenum, aluminum or copper, may be used as the lamina 6. Silicone adhesives as well as epoxy resin systems made conductive by incorporating metal particles may be used as electrically conductive adhesives. It is advantageous to first provide, e.g., a large-area silver foil and also the corners of the conductively coated cover glasses 10 with a primer suitable for silicone adhesives, to subsequently punch or etch the laminas out of the silver foil, to spread it out on a clean substrate (clean paper) with the primer-coated side facing upward, to apply the conductive silicone adhesive to the laminas according to a screen printing technique and to finally press the laminas onto the primer-coated corners of the cover glass as well as the electrically insulating material 13 located between them and to optionally fix it with a weakly adhering adhesive tape until the bonding is completed.

For example, an electrically nonconductive silicone adhesive may be used as the electrically insulating material 13, but other materials, e.g., plastics releasing only small amounts of gas may be used as well.

The technique described can be applied especially meaningfully and advantageously in the case of thin-layer solar cells with a thickness of, e.g., 0.1 mm, including the cover glasses, in which case the laminas to be used as connectors may consist of foils with a thickness of, e.g., 12.5 $\mu$m.

While a specific embodiment of the invention has been shown and described in detail to illustrate the application of the principles of the invention, it will be understood that the invention may be embodied otherwise without departing from such principles.

What is claimed is:

1. A solar module, comprising:
   a plurality of individual solar cells;
   a support, said individual solar cells being fastened to said support in an arrangement;
   a plurality of cover glass elements, each cover glass element being on a side of said individual solar cells facing away from said support;
   a transparent, conductive coating provided on said cover glass elements on a side of said cover glass elements facing away from said solar cells;
   electrically conductive connectors bonded to said transparent conductive coating at a location adjacent to corners of said cover glass elements, said cover glass elements being in electrical contact with one another through said electrically conductive connectors;
   electrically insulating material introduced in areas of mutually adjacent corners between said cover glass elements; and
   conductive adhesive, said electrically conductive connectors being laminas bonded to said corners and bonded to a surface of said insulating material located between said corners.

2. The solar module in accordance with claim 1, wherein said electrically insulating material is arranged in a cross-like arrangement between four adjacent corners each.

3. The solar module in accordance with claim 1, wherein said electrically insulating material is introduced only between two mutually adjacent corners.

4. The solar module in accordance with claim 1, wherein said electrically insulating material extends down to said support.

5. The solar module in accordance with claim 4, wherein said electrically insulating material is an adhesive, and said solar cells are bonded with said electrically insulating material to said support.

* * * * *